(12) United States Patent
Marshall et al.

(10) Patent No.: US 7,714,642 B2
(45) Date of Patent: May 11, 2010

(54) INTEGRATED VIRTUAL VOLTAGE CIRCUIT

(75) Inventors: Andrew Marshall, Dallas, TX (US); Theodore W. Houston, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/553,903

(22) Filed: Oct. 27, 2006

(65) Prior Publication Data

US 2008/0100369 A1    May 1, 2008

(51) Int. Cl.
*G05F 1/10* (2006.01)
(52) U.S. Cl. .................................. 327/544; 327/534
(58) Field of Classification Search ............... 327/544, 327/534
See application file for complete search history.

(56) References Cited

U.S. PATENT DOCUMENTS

| | | | | |
|---|---|---|---|---|
| 5,598,041 A | * | 1/1997 | Willis | 307/43 |
| 6,836,179 B2 | * | 12/2004 | Mizuno et al. | 327/544 |
| 2006/0232321 A1 | * | 10/2006 | Chuang et al. | 327/427 |
| 2007/0005999 A1 | * | 1/2007 | Rusu et al. | 713/300 |
| 2007/0096794 A1 | * | 5/2007 | Houston et al. | 327/534 |
| 2007/0170897 A1 | * | 7/2007 | Williams | 323/222 |
| 2008/0122519 A1 | * | 5/2008 | Nowak | 327/534 |

* cited by examiner

*Primary Examiner*—Lincoln Donovan
*Assistant Examiner*—Ryan C Jager
(74) *Attorney, Agent, or Firm*—Warren L. Franz; Wade J. Brady, III; Frederick J. Telecky, Jr.

(57) ABSTRACT

The present invention provides an integrated virtual voltage circuit for use with a sub-circuit. In one embodiment, the integrated virtual voltage circuit includes a MOS transistor switch coupled to a supply voltage and configured to employ a drain to provide an operating voltage for the sub-circuit during switch activation. Additionally, the integrated virtual voltage circuit also includes a connection unit coupled to the MOS transistor switch and configured to provide a standby voltage for the sub-circuit during deactivation of the MOS transistor switch wherein the standby voltage is based on a static coupling of the drain to a body region of the MOS transistor switch. In an alternative embodiment, the connection unit is further configured to connect a voltage reference between the supply voltage and the drain of the MOS transistor switch to determine the standby voltage.

25 Claims, 1 Drawing Sheet

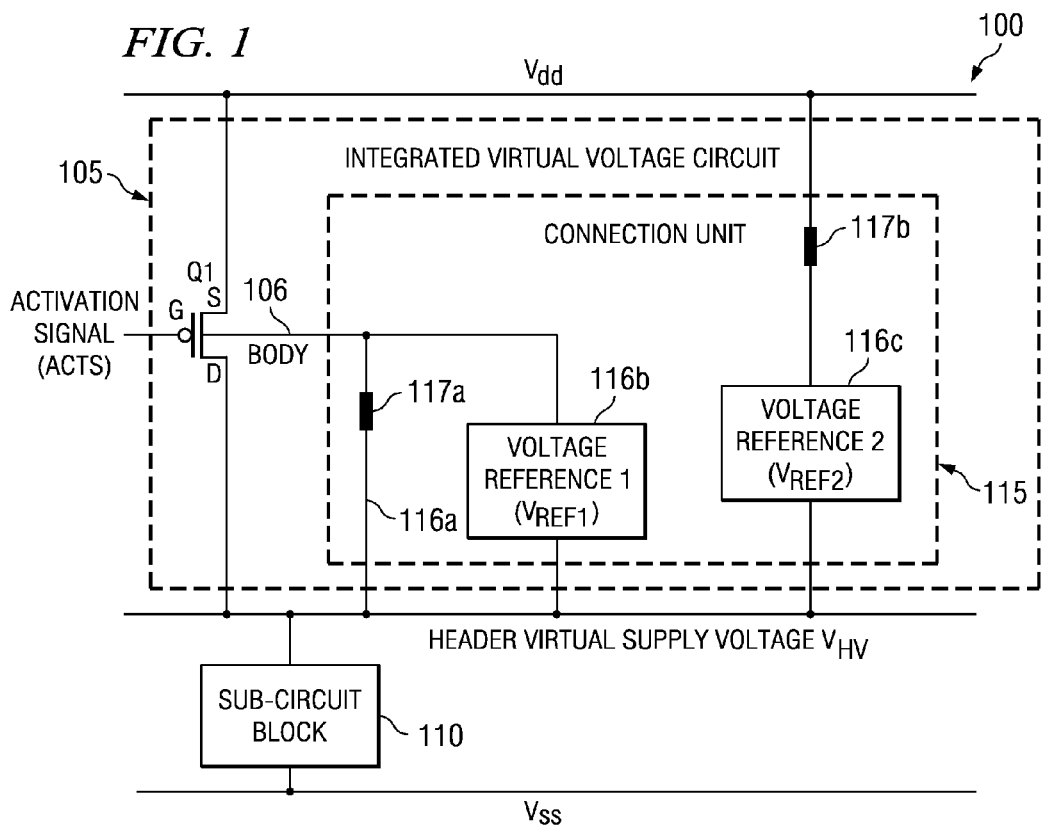
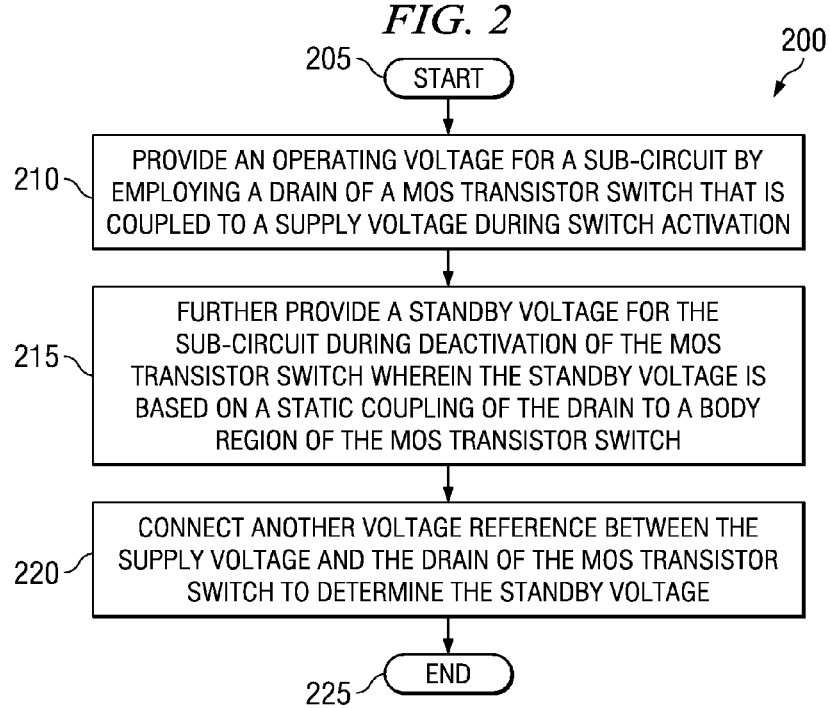

INTEGRATED VIRTUAL VOLTAGE CIRCUIT

TECHNICAL FIELD OF THE INVENTION

The present invention is directed, in general, to microelectronics and, more specifically, to an integrated virtual voltage circuit, a method of operating a virtual voltage circuit and a sub-circuit power supply employing the circuit or the method.

BACKGROUND OF THE INVENTION

Integrated circuit systems are rapidly increasing in device count and operating speed. Each of these attributes tends to increase power requirements directly, while both together cause power requirements to increase exponentially. Therefore, dealing with power requirements associated with integrated circuit systems is becoming a much more critical design arena than before. One such management technique involves separating the integrated circuits that require full power all of the time to perform their intended tasks from those that may use reduced power to perform some of their intended tasks at least some of the time.

Supplying and removing electrical current, either partially or completely, from a block of circuitry may be controlled by header or footer transistors. The header transistor forms a controllable switch between a positive power supply and a sub-circuit block. Similarly, the footer transistor forms a controllable switch between a negative power supply and the sub-circuit block. Activation of the header or footer transistor allows a virtual supply to be connected to the sub-circuit block. Often, both header and footer transistors are employed to provide both positive and negative virtual supplies concurrently when the block of sub-circuitry is active. Similarly, header and footer transistors are used to reduce current to blocks of sub-circuitry during their inactive modes of operation.

A conventional approach to providing an operating virtual voltage to the sub-circuit uses the drain of a conducting header or footer MOS transistor wherein its source and body region are connected to a supply voltage. Then, the forward voltage drop of a separate, external junction diode that is parallel-connected to the MOS transistor is used to provide a standby virtual voltage for the sub-circuit when the MOS transistor is not conducting. This approach is bulky, thereby adding to die size and an increased risk of defects, which reduces chip yield.

Accordingly, what is needed in the art is a more efficient way of providing virtual operating and standby voltages.

SUMMARY OF THE INVENTION

To address the above-discussed deficiencies of the prior art, the present invention provides an integrated virtual voltage circuit for use with a sub-circuit. In one embodiment, the integrated virtual voltage circuit includes a MOS transistor switch coupled to a supply voltage and configured to employ a drain to provide an operating voltage for the sub-circuit during switch activation. Additionally, the integrated virtual voltage circuit also includes a connection unit coupled to the MOS transistor switch and configured to provide a standby voltage for the sub-circuit during deactivation of the MOS transistor switch wherein the standby voltage is based on a static coupling of the drain to a body region of the MOS transistor switch. In an alternative embodiment, the connection unit is further configured to connect a voltage reference between the supply voltage and the drain of the MOS transistor switch to determine the standby voltage.

In another aspect, the present invention provides a method of operating an integrated virtual voltage circuit for use with a sub-circuit. The method includes providing an operating voltage for the sub-circuit by employing a drain of a MOS transistor switch that is coupled to a supply voltage during switch activation. The method also includes further providing a standby voltage for the sub-circuit during deactivation of the MOS transistor switch wherein the standby voltage is based on a static coupling of the drain to a body region of the MOS transistor switch.

The present invention also provides, in yet another aspect, a sub-circuit power supply. The sub-circuit power supply includes a supply voltage and an integrated virtual voltage circuit. The integrated virtual supply voltage has a MOS transistor switch, coupled to the supply voltage, that employs a drain to provide an operating voltage for a sub-circuit during switch activation. The integrated virtual supply voltage also has a connection unit, coupled to the MOS transistor switch, that provides a standby voltage for the sub-circuit during deactivation of the MOS transistor switch wherein the standby voltage is based on a static coupling of the drain to a body region of the MOS transistor switch.

The foregoing has outlined preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention.

BRIEF DESCRIPTION OF THE DRAWINGS

For a more complete understanding of the present invention, reference is now made to the following descriptions taken in conjunction with the accompanying drawings, in which:

FIG. 1 illustrates a sub-circuit power supply as provided by one embodiment of the invention; and FIG. 2 illustrates a flow diagram of an embodiment method of operating an integrated virtual voltage circuit carried out in accordance with the principles of the present invention.

DETAILED DESCRIPTION

Embodiments of an integrated virtual voltage circuit that may be employed as a header or footer supply for a sub-circuit are presented. In general, a single (or distributed) MOS transistor switch, having its source coupled to a supply voltage, employs its drain to provide an operating voltage with a value near the supply voltage for the sub-circuit when activated, and a selected standby voltage when deactivated. In one embodiment, a body region of the MOS transistor switch is statically coupled to its drain to provide the standby voltage.

FIG. 1 illustrates a sub-circuit power supply 100 as provided by one embodiment of the invention. The power supply 100 includes an integrated virtual voltage circuit 105 that functions as a header supply for a sub-circuit block 110. The integrated virtual voltage circuit 105 is coupled to a header supply voltage $V_{dd}$ and provides a header virtual supply voltage $V_{HV}$ to the sub-circuit block 110, which is also coupled to a footer supply voltage $V_{ss}$.

The integrated virtual voltage circuit 105 includes a MOS transistor switch Q1 (a PMOS transistor in this case) and a connection unit 115. A transistor source S of the MOS transistor switch Q1 is coupled to the header supply voltage $V_{dd}$. The MOS transistor switch Q1 employs a transistor drain D to provide an operating voltage for the sub-circuit block 110 during switch activation. The connection unit 115 is coupled to the MOS transistor switch Q1 and provides a standby voltage for the sub-circuit during deactivation of the MOS transistor switch Q1. The standby voltage is based on a static coupling of the transistor drain D to a body region 106 of the MOS transistor switch Q1. Activation and deactivation of the MOS transistor switch Q1 is provided by an activation signal ACTS connected to its transistor gate G.

In the illustrated embodiment, the static coupling provided by the connection unit 115 may be selected from a direct electrical connection 116a or a first voltage reference 116b that provides a first reference voltage $V_{REF1}$. In an alternative embodiment, the connection unit 115 employs a second voltage reference 116c, coupled between the header supply voltage $V_{dd}$ and the transistor drain D of the MOS transistor switch Q1, to provide a second reference voltage $V_{REF2}$ that determines the standby voltage. Therefore, the header virtual supply voltage $V_{HV}$ toggles between the operating voltage and the standby voltage based on activation or deactivation of the MOS transistor switch Q1, respectively.

During switch activation, the MOS transistor switch Q1 is conducting and the body region 106 is just a few millivolts below the voltage of the transistor source S thereby providing an operating voltage that is approximately equal to the header supply voltage $V_{dd}$. This also gives a small, though noticeable, improvement in current drive resulting in the possibility of reducing the MOS transistor switch Q1 in size by some small percentage. Connecting the MOS transistor switch Q1 in the unconventional and novel manner of coupling the body region 106 to the transistor drain D, instead of the transistor source S, provides a saving in semiconductor real estate and simplifies circuit design over using an external diode.

The illustrated embodiment of the connection unit 105 also includes first and second fusible links 117a, 117b that allow selection of an appropriate standby voltage for the sub-circuit block 110. For example, if the first fusible link 117a remains shorted, and the second fusible link 117b is opened, the body region 106 is directly connected to the transistor drain D thereby allowing the deactivated MOS transistor switch Q1 to completely determine the value of the standby voltage. In this case, the forward voltage drop from the transistor source S to body region 106 determines the standby voltage with respect to the header supply voltage Vdd.

During turn-on of the MOS transistor switch Q1, the body region 106 may be forward biased by up to a few tenths of a volt. This makes turn-on more efficient and faster. Speed of turn-on may be the controlling factor in sizing the MOS transistor switch Q1. If so, the size of the MOS transistor switch Q1 may be further reduced and additionally, the drive circuitry to turn on the MOS transistor switch Q1 may be simplified. Turn-off of the MOS transistor switch Q1 may be slightly slower, but its turn-off is not usually a critical consideration.

If a lower standby voltage is required across the sub-circuit block 110, the first voltage reference 116b may be added as a supplemental voltage thereby providing the first reference voltage $V_{REF1}$ in series with the voltage drop of the body region 106. This may be accomplished by opening both the first and second fusible links 117a, 117b in the illustrated embodiment of FIG. 1. In an alternative embodiment, the first reference voltage $V_{REF1}$ may be made selectable by employing a set of voltage references for the first voltage reference 116b that are either added or deleted as required. This allows fine tuning of the reduced standby voltage.

A higher standby voltage may be needed across the sub-circuit block 110. This requires a lower voltage drop between the header supply voltage $V_{dd}$ and the transistor drain D than is provided by the forward voltage drop from the transistor source S to body region 106. In this case, the second voltage reference 116c may be employed to provide a value of the second reference voltage $V_{REF2}$ that is smaller than the forward voltage drop from the transistor source S to body region 106.

This is accomplished by leaving both the first and second fusible links 117a, 117b shorted, wherein the smaller value of the second reference voltage VREF2 controls the standby voltage. Similarly, the second reference voltage VREF2 may be made selectable by employing a set of voltage references for the second voltage reference 116c that are either added or deleted as required. This allows fine tuning of the increased standby voltage.

Of course, one skilled in the pertinent art will understand that an analogous integrated virtual voltage circuit may be employed as a footer supply for the sub-circuit block 110. This requires using a MOS transistor switch of opposite polarity (i.e., an NMOS transistor switch) to provide a footer virtual supply voltage $V_{FV}$ between the footer supply voltage $V_{ss}$ and the sub-circuit block 110. This footer supply may be used in combination with a header supply or separately as required. Typically, employing both header and footer supplies requires concurrent activation and deactivation of the corresponding MOS transistor switches. Additionally, each of the respective body regions employed is typically electrically isolated from a substrate of the MOS transistor switches.

FIG. 2 illustrates a flow diagram of an embodiment method of operating an integrated virtual voltage circuit, generally designated 200, carried out in accordance with the principles of the present invention. The method 200 is for use with a sub-circuit and starts in a step 205. Then, an operating voltage for the sub-circuit is provided by employing a drain of a MOS transistor switch that is coupled to a supply voltage during switch activation in a step 210. A standby voltage for the sub-circuit during deactivation of the MOS transistor switch is further provided, in a step 215, wherein the standby voltage is based on a static coupling of the drain to a body region of the MOS transistor switch.

In one embodiment, the static coupling is a direct electrical connection between the drain and the body region of the MOS transistor switch. This static coupling provides an internal diode voltage drop between the supply voltage and the sub-circuit. In an alternative embodiment, the static coupling is a voltage reference providing a reference voltage that is connected between the drain and the body region of the MOS transistor switch. Employing the reference voltage in series with the internal diode voltage drop reduces the standby voltage for the sub-circuit. Additionally, the voltage reference may provide a selectable reference voltage for connection between the drain and the body region of the MOS transistor switch.

In a step 220, another voltage reference providing another reference voltage may be connected between the supply voltage and the drain of the MOS transistor switch to determine the standby voltage. In this embodiment, this reference voltage is typically smaller than the internal diode voltage drop of the MOS transistor switch. This arrangement thereby provides a standby voltage for the sub-circuit that is greater than that provided by employing just the internal voltage drop. As an alternative, this reference voltage may provide a controlled voltage drop lower than the internal diode voltage drop for lower temperature conditions, and a diode voltage drop in other, higher temperature conditions. Additionally, this voltage reference may also provide another selectable reference voltage for connection between the drain and the body region of the MOS transistor switch. In the illustrated embodiment of the method 200, the static coupling or the other voltage reference may be selectable by employing a fusible link.

While the method disclosed herein has been described and shown with reference to particular steps performed in a particular order, it will be understood that these steps may be combined, subdivided, or reordered to form an equivalent method without departing from the teachings of the present invention. Accordingly, unless specifically indicated herein, the order or the grouping of the steps is not a limitation of the present invention.

In summary, embodiments of the present invention employing an integrated virtual voltage circuit, a method of operating an integrated virtual voltage circuit and a sub-circuit power supply employing the circuit or the method have been presented. Advantages include employing the drain of a single MOS transistor switch to provide a virtual supply voltage for the sub-circuit. This provides an operating virtual voltage that is close to a supply voltage and a standby virtual voltage that may be determined by statically coupling the drain of the MOS transistor switch to its body region. In one embodiment, this allows using the internal source to body region diode and thereby avoids the use of an external diode. Other embodiments illustrated using external voltage references that may be employed to either raise or lower the standby virtual voltage of the sub-circuit.

Those skilled in the art to which the invention relates will appreciate that other and further additions, deletions, substitutions and modifications may be made to the described embodiments without departing from the scope of the invention.

What is claimed is:

1. An integrated circuit including a virtual voltage circuit for use with a sub-circuit, comprising:
    a MOS transistor with a source coupled to receive a supply voltage, a gate coupled to receive an activation signal for activation or deactivation of the MOS transistor, a drain coupled to provide an operating voltage for the sub-circuit during activation of the MOS transistor, and a body region; and
    a connection unit coupled to the MOS transistor and configured to provide a standby voltage for the sub-circuit during deactivation of the MOS transistor, wherein the standby voltage is set by an internal voltage drop from the source to the body region by a static coupling of the body region and the drain.

2. The circuit of claim 1, wherein the static coupling is a direct electrical connection between the body region and the drain; and the standby voltage is set by the internal voltage drop applied by the direct electrical connection when the MOS transistor is deactivated.

3. The circuit of claim 1, wherein the static coupling is a voltage reference connected between the body region and the drain; and the standby voltage is set by the internal voltage drop in series with the voltage reference when the MOS transistor is deactivated.

4. The circuit of claim 3, wherein the voltage reference provides a selectable reference voltage for connection between the body region and the drain.

5. The circuit of claim 1, wherein the connection unit is further configured to connect another voltage reference between the source and the drain to determine the standby voltage.

6. The circuit of claim 5, wherein the another voltage reference provides a selectable reference voltage for connection between the source and the drain.

7. The circuit of claim 1, wherein the static coupling is selectable by a fusible link.

8. A method of operating an integrated circuit including a virtual voltage circuit for use with a sub-circuit, comprising:
    providing a MOS transistor with a source coupled to a supply voltage, a drain coupled to the sub-circuit, and a body region;
    providing an operating voltage to the sub-circuit when the MOS transistor is activated; and
    providing a standby voltage set by an internal voltage drop from the source to the body region by a static coupling of the body region and the drain when the MOS transistor is deactivated.

9. The method of claim 8, wherein the static coupling is a direct electrical connection between the body region and the drain; and the standby voltage is set by the internal voltage drop through the direct electrical connection when the MOS transistor is deactivated.

10. The method of claim 8, wherein the static coupling is a voltage reference connected between the body region and the drain; and the standby voltage is set by the internal voltage drop in series with the voltage reference when the MOS transistor is deactivated.

11. The method of claim 10, wherein the voltage reference provides a selectable reference voltage for connection between the body region and the drain.

12. The method of claim 8, wherein another voltage reference is connected between the source and the drain to determine the standby voltage.

13. The method of claim 12, wherein the another voltage reference provides a selectable reference voltage for connection between the source and the drain.

14. The method of claim 8, wherein the static coupling is selectable by a fusible link.

15. An integrated circuit including a virtual voltage circuit for use with a sub-circuit, comprising:
    a MOS transistor with a source coupled to receive a supply voltage, a drain coupled to provide an operating voltage to the sub-circuit when the MOS transistor is activated, a gate coupled to receive an activation signal for activation or deactivation of the MOS transistor, and a body region; and
    a direct connection between the body region and the drain for providing a standby voltage to the sub-circuit set by an internal voltage drop from the source to the body region through the direct connection when the MOS transistor is deactivated; and
    a first voltage reference coupled in parallel with the direct connection between the body region and the drain.

16. The circuit of claim 15, further comprising an element for selectively decoupling the direct connection from between the body region and the drain; whereby when the MOS transistor is deactivated and the direct connection is decoupled from between the body region and the drain, the standby voltage is set by the internal voltage drop in series with the first voltage reference.

17. The circuit of claim 16, wherein the element for selectively decoupling the direct connection from between the body region and the drain comprises a fusible link.

18. The circuit of claim 16, further comprising a second voltage reference coupled in parallel with the MOS transistor between the source and the drain; and an element for selectively decoupling the second voltage reference from between the source and the drain; whereby when the MOS transistor is deactivated, the direct connection is decoupled from between the body region and the drain, and the second voltage reference is decoupled from between the source and the drain, the standby voltage is set by the internal voltage drop in series with the first voltage reference; and whereby when the MOS transistor is deactivated, and the second voltage reference is coupled between the source and the drain, the standby voltage is set by the second voltage reference.

19. The circuit of claim 18, wherein at least one of the element for selectively decoupling the direct connection from between the body region and the drain or the element for selectively decoupling the second voltage reference from between the source and the drain comprises a fusible link.

20. The circuit of claim 18, wherein the element for selectively decoupling the direct connection from between the body region and the drain comprises a first fusible link; and the element for selectively decoupling the second voltage reference from between the source and the drain comprises a second fusible link.

21. An integrated circuit including a virtual voltage circuit for use with a sub-circuit, comprising:
- a MOS transistor with a source coupled to receive a supply voltage, a drain coupled to provide an operating voltage set by the supply voltage to the sub-circuit when the MOS transistor is activated, a gate coupled to receive an activation signal for activation or deactivation of the MOS transistor, and a body region; and
- a first voltage reference element connected between the body region and the drain for providing a standby voltage to the sub-circuit set by an internal voltage drop from the source to the body region in series with the first reference voltage when the MOS transistor is deactivated.

22. The circuit of claim 21, further comprising a direct connection between the body region and the drain; and an element for selectively coupling or uncoupling at least one of the direct connection or the first voltage reference to or from the drain; whereby when the direct connection is coupled between the body region and the drain, the standby voltage is set by the internal voltage drop when the MOS transistor is deactivated; and when the direct connection is decoupled from between the body region and the drain and the first voltage reference is coupled between the body region and the drain, the standby voltage is set by the internal voltage drop in series with the first voltage reference when the MOS transistor is deactivated.

23. The circuit of claim 22, wherein the element for selectively coupling or uncoupling comprises a fusible link.

24. The circuit of claim 22, further comprising a second voltage reference coupled in parallel with the MOS transistor between the source and the drain; and an element for selectively coupling or decoupling the second reference voltage to or from between the source and the drain; whereby when the direct connection is coupled between the body region the drain and the second voltage reference is decoupled from between the body region and the drain, the standby voltage is set by the internal voltage drop when the MOS transistor is deactivated; when the direct connection is decoupled from between the body region and the drain, the first voltage reference is coupled between the body region and the drain, and the second voltage reference is decoupled from between the source and the drain, the standby voltage is set by the internal voltage drop in series with the first voltage reference when the MOS transistor is deactivated; and when the second voltage reference is coupled between the source and the drain, the standby voltage is set by the second voltage reference when the MOS transistor is deactivated.

25. The circuit of claim 24, wherein the elements for selectively coupling or decoupling comprise fusible links.

* * * * *